United States Patent [19]

Cheng et al.

[11] Patent Number: 5,513,122
[45] Date of Patent: Apr. 30, 1996

[54] METHOD AND APPARATUS FOR DETERMINING THE REACHABLE STATES IN A HYBRID MODEL STATE MACHINE

[75] Inventors: Kwang-Ting Cheng, Santa Barbara, Calif.; Anjur S. Krishnakumar, Rocky Hill, N.J.

[73] Assignee: AT&T Corp., Murray Hill, N.J.

[21] Appl. No.: 254,218

[22] Filed: Jun. 6, 1994

[51] Int. Cl.$^6$ .......................... G05B 19/045; G06F 11/26
[52] U.S. Cl. ...................... 364/489; 364/488; 364/578; 395/500
[58] Field of Search ................................... 364/488, 489, 364/490, 491, 578; 395/500

[56] References Cited

U.S. PATENT DOCUMENTS

| | | | |
|---|---|---|---|
| 4,694,411 | 9/1987 | Burrows | 364/578 |
| 5,005,136 | 4/1991 | Van Berkel et al. | 364/490 |
| 5,038,307 | 8/1991 | Krishnakumar et al. | 364/578 |
| 5,140,538 | 8/1992 | Bass et al. | 364/602 |
| 5,163,016 | 11/1992 | Har'El et al. | 364/578 |
| 5,331,568 | 7/1994 | Pixley | 364/489 |
| 5,394,347 | 2/1995 | Kita et al. | 364/578 |

OTHER PUBLICATIONS

Alur, R., et al., "An Implementation of Three Algorithms for Timing Verification Based on Automata Emptiness," Proceedings of the Real–Time Systems Symposium, Phoenix, Arizona, Dec. 2–4, 1992, pp. 157–166.

Burch, J. R., et al., "Sequential Circuit Verification Using Symbolic Model Checking," 27th ACM/IEEE Design Automation Conference, Orlando, Florida, Jun. 24–28, 1990, pp. 46–51.

Cheng, K.-T., Krishnakumar, A. S., "Automatic Functional Test Generation Using The Extended Finite State Machine Model," Proceedings of the 30th Design Automation Conference, Dallas, Texas, Jun. 14–18, 1993, pp. 86–91.

Cho, H., et al., "ATPG Aspects of FSM Verification," Digest of Technical Papers, IEEE International Conference on Computer–Aided Design, Santa Clara, CA, Nov. 11–15, 1990, pp. 134–137.

Coudert, O., and Madre, J. C., "A Unified Framework for the Formal Verification of Sequential Circuits," IEEE International Conference on Computer–Aided Design, Santa Clara, CA, Nov. 11–15, 1990, pp. 126–129.

Coudert, O., et al., "Verification of Synchronous Sequential Machines Based on Symbolic Execution," *Lecture Notes in Computer Science*, Automatic Verification Methods for Finite State Systems, Proc. of Intern. Workshop, Grenoble, France, Jun. 12–14, 1989, pp. 365–373.

Devadas, S., et al., "Design Verification and Reachability Analysis Using Algebraic Manipulation," Proc. of IEEE Inter. Conference on Computer Design: VLSI in Computers & Processors, Cambridge, MA, Oct. 14–16, 1991, pp. 250–258.

Dill, D. L., "Timing Assumptions and Verification of Finite–State Concurrent Systems," *Lecture Notes in Computer Science*, Automatic Verification Methods for Finite State Systems, Proc. on International Workshop, Grenoble, France, Jun. 12–14, 1989, pp. 197–212.

(List continued on next page.)

*Primary Examiner*—Kevin J. Teska
*Assistant Examiner*—Russell W. Frejd

[57] ABSTRACT

The present invention provides a method and apparatus for more efficiently validating high-level specifications of sequential digital systems, and in particular, those represented by hybrid models. According to the present invention, the high-level representation of a system is converted into a direct sum EFSM. An operator or a data file then provides an initial configuration or set of initial configurations of states and variable values. The method of the present invention then determines the set of configuration reachable from the initial configuration through symbolic execution of the direct sum EFSM. By representing the transitional relations of the machine as the and-product of Boolean expressions and arithmetic expressions, each class of expressions may be processed separately. When complete, the symbolic execution produces a cover of the set of reachable states. The results may then be reviewed to determine if the given specification produces unexpected or incompatible results.

20 Claims, 6 Drawing Sheets

OTHER PUBLICATIONS

Hopcroft, J., and Pansiot, J.-J., "On the Reachability Problem for 5-Dimensional Vector Addition Systems," Theoretical Computer Science, No. 8, 1979, pp. 135-159.

Touati, H. J., et al., "Implicit State Enumeration of Finite State Machines Using BDD's," Digest of Technical Papers, IEEE Intern. Conf. on Computer-Aided Design, Santa Clara, CA, Nov. 11-15, 1990, pp. 130-133.

METHOD AND APPARATUS FOR DETERMINING THE REACHABLE STATES IN A HYBRID MODEL STATE MACHINE

FIELD OF THE INVENTION

The present invention relates generally to the field of digital circuit design specification verification. In particular, the present invention relates to the field of determining the set of reachable states in a hybrid model of a high level specification.

BACKGROUND OF THE INVENTION

Designers of sequential digital circuits increasingly employ high level software languages to specify complex designs. For example, a given hardware model may have a high-level representation in VHDL or BESTMAP-C, which are hardware description languages. The designer may then employ software tools to develop an appropriate circuit design from the given high-level description or specification.

An important operation in this process is the verification or validation of the high-level specification. If the high-level specification contains inaccuracies or produces incongruous results, then the circuit designed therefrom will contain faults. To validate the specification, therefore, the designer must ensure that the set of all possible input configurations produces the proper response. One method of performing the validation step is to apply every possible input configuration to the high-level specification and observe the results. For designs of large complexity, and particularly for large sets of distinct input configurations, such a method is impractical.

Consider, for example, a given circuit specification that involves the manipulation of three non-negative integer variables, a, b and c, which may be, for example, counter values. Suppose the circuit designer is required to know the range of possible results given any initial starting point {a,b,c} where a<20, b<10 and c is unrestricted. In such a situation, executing each possible configuration of a, b and c individually would require a minimum of 200 executions and possibly significantly more, depending on the upper limit of possible values of c.

An alternative method of validating a specification, which involves employing the symbolic execution of state machine models, is disclosed in Coudert, et al., "Verification of Synchronous Sequential Machines Based on Symbolic Execution," *Automatic Verification Methods for Finite State Systems*, LNCS No. 407 (Springer Verlag 1990); and Dill, "Timing Assumptions and Verification of Finite-State Concurrent Systems," *Automatic Verification Methods for Finite State Systems*, LNCS No. 407 (Springer Verlag 1990), both of which are incorporated herein by reference. Coudert, et al., show how a high-level description may be executed symbolically to provide the set of reachable values from a particular set of input sequences. In this method, the high-level description is first converted into a state machine representation. Symbolical execution of the state machine then provides the set of reachable values or configurations.

Symbolic execution methods evaluate a particular model by executing the state machine using sets of configurations, as opposed to individual configurations. As a result, the use of symbolic execution can greatly reduce the time and effort needed for validation of a specification.

Consider again, for example, the system described above involving the integer variables a, b and c. In symbolic execution, the state machine model is executed once for the set of configurations of {a,b,c} where a<20, b<10 and c is unrestricted. Such a set is often referred to as a region. The use of the term region reflects the fact that sets of configurations given as linear functions or linear inequalities may be represented graphically as regions.

The results of the symbolic execution yield a cover, or a potentially redundant set, of the reachable configurations. The set of reachable configurations reveals to a circuit designer whether a prohibited configuration may possibly be reached under the model. If, for example, the cover includes the point {25, 28, 40}, and it is known that the point {25, 28, 40} would cause system error the designer becomes informed of a flaw in the high-level specification. In comparison, if each individual initial configuration of {a,b,c} within the initial region is separately executed, hundreds of possible starting points may have to be executed through the model before such an error point is reached.

Symbolic execution methods have been described for circuit specifications which are modelled using boolean variables and expressions in Coudert, et al, above. These known methods utilize binary decision diagram manipulation in order to effect symbolic execution on the state machine models. Additionally, symbolic execution methods have also been described for circuit specifications consisting of arithmetic variables, Dill, et al, above. Arithmetic variables, as opposed to Boolean variables, represent non-negative integers in sequential circuit models.

In some cases, however, a high-level specification or model may include both Boolean and arithmetic variables. Such models are known as hybrid models. A current technique of performing symbolic execution methods on hybrid models requires expanding the arithmetic variables and expressions to their Boolean equivalent representation. By representing all variables homogeneously as Boolean variables, the symbolic execution techniques discussed by Coudert, et al, above may be implemented.

The conversion of arithmetic variables to Boolean variables, however, introduces inefficiency, particularly in complex hybrid models. One particular problem in the Boolean expansion of arithmetic variables is that a maximum word size must be defined for each arithmetic variable to be expanded. For example, to expand an arithmetic variable "a" a designer must define a maximum value of "a" in order to determine how many Boolean variables must be created to replace it. For example, if the value of "a" is always less than 8, then a three bit or three variable Boolean expansion is adequate. If, however, the maximum value of "a" reaches 100, at least a seven bit or seven variable Boolean expansion is required.

SUMMARY OF THE INVENTION

The present invention provides a method and apparatus for more efficiently validating high-level specifications of sequential digital systems, and in particular, those represented by hybrid models. According to the present invention, the high-level representation of a system is converted into an extended finite state machine or EFSM. The EFSM is thereafter converted to a direct sum EFSM. The direct sum machine is an EFSM wherein hybrid state transition enabling functions and update functions are represented in direct sum form.

An operator or a data file then provides an initial configuration or set of initial configurations of states and variable values. The method of the present invention then determines the set of configurations reachable from the initial configuration through symbolic execution of the direct sum EFSM. By representing the transitional relations of the machine in direct sum form, powerful Boolean and arithmetic techniques may both be applied during symbolic execution of the model. When complete, the symbolic execution produces a cover of the set of reachable states. The cover represents the possible values reachable from the initial configuration. The results may then be reviewed to determine if the given specification produces unexpected or incompatible results.

The above discussed features, as well as additional features and advantages of the present invention, will become apparent by reference to the following detailed description and accompanying drawings.

DETAILED DESCRIPTION OF THE DRAWINGS

Figure 1:
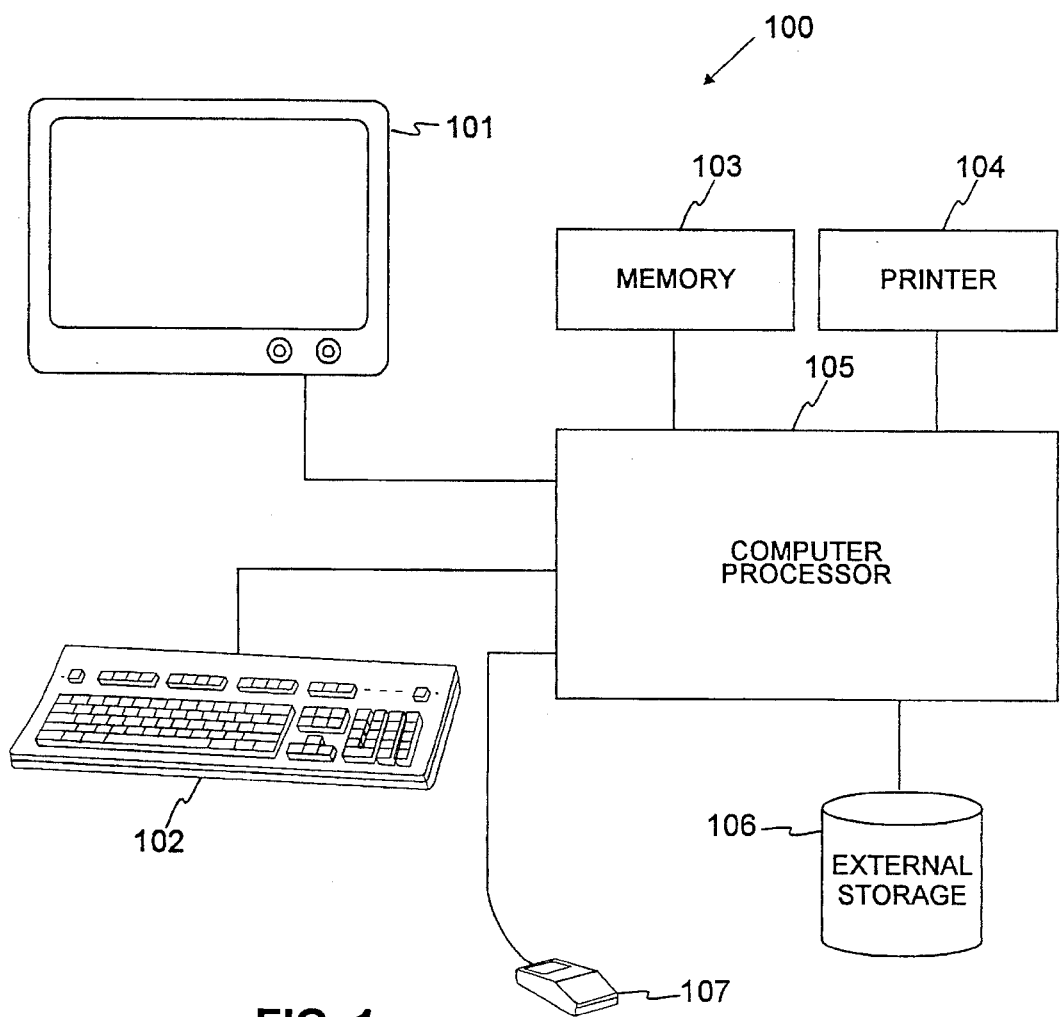
FIG. 1 illustrates an interactive computer system which may suitably execute the sequential circuit specification validation according to the present invention.

FIG. 1 illustrates an interactive computer system 100. The computer system 100 may be employed to execute the functions discussed below in connection with FIGS. 2, 4, 5 and 6. The computer system 100 comprises a display monitor 101 for the display of graphical and textual information, interactive means including a keyboard 102 for textual entry of information and a mouse 107 for the entry of graphical data, a computer processor 105, data storage means including a memory 103 and an external storage device 106, and a printer 104. The computer processor 105 is connected to the memory 103, the display monitor 101, the keyboard 102, the mouse 107, the printer 104 and the external storage device 106. The general purpose computer 100 may suitably be any one of the types which are well known in the art such as a mainframe computer, a minicomputer, a work station, or a personal computer. In one embodiment of the invention, the computer processor 105 executes the program code necessary to implement the invention. The program code may suitably be stored in the external storage device 106 and loaded into the local memory 103 prior to execution.

Figure 2:
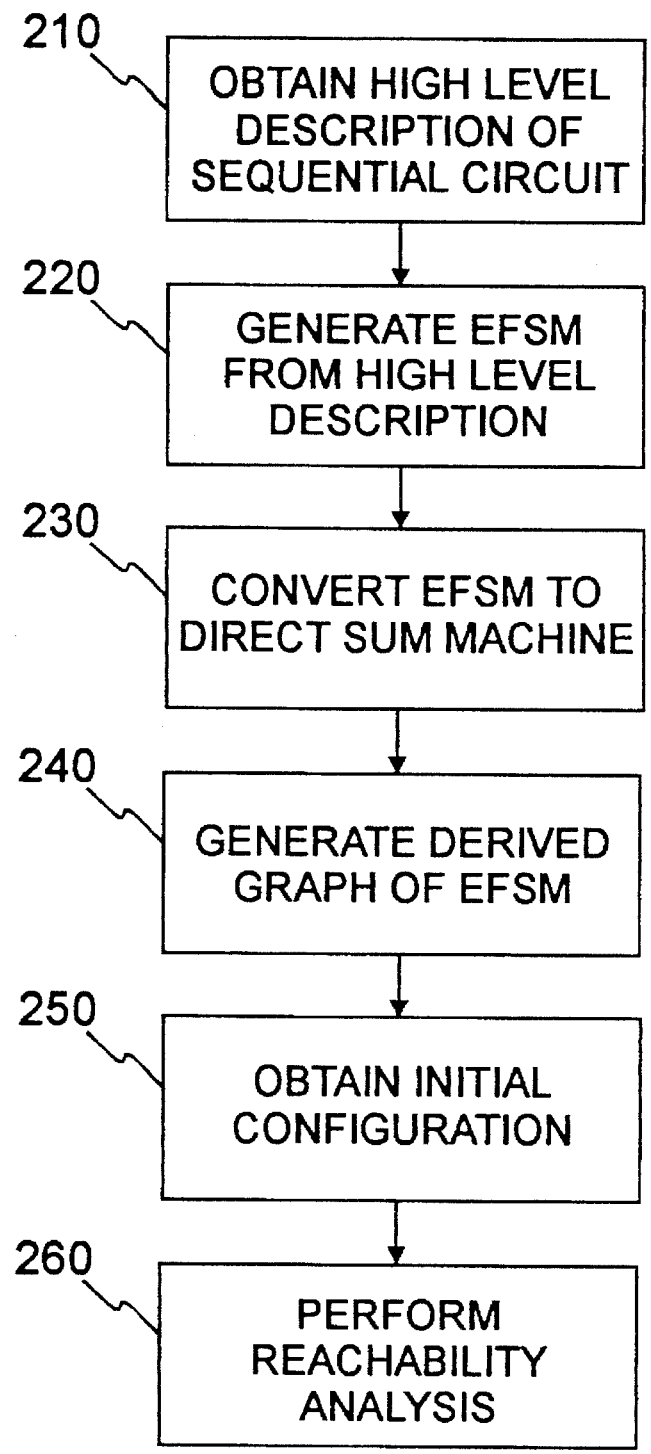
FIG. 2 illustrates a summary functional flow diagram of one of the validation techniques according to the present invention.

FIG. 2 illustrates a summary block diagram of the functions performed to validate a specification for a sequential circuit according to the present invention. One of ordinary skill in the art could generate program code for use in a computer, such as the computer 100, to accomplish the functions discussed below. In general, the method of the present invention executes, in sequence, steps 210, 220, 230, 240, 250 and 260.

In step 210, a high-level description of the specification for a sequential circuit is provided for validation. It is well-known in the art to provide a high-level representation of a hardware model, for example, in VHDL or BESTMAP-C form. See, for example, J. -Y. Jou, et al, "BESTMAP: Behavioral Synthesis from C" Proc Intl Workshop on Logic Synthesis, May 1989, which is incorporated herein by reference. The high-level specification may suitably be provided from a storage means, such as the external storage device 106 in FIG. 1. An example of a BESTMAP-C representation of a specification for a sequential circuit including, for example, a counter, is given in Table 1.

TABLE 1

```
switch(state) {
    case S0:
        y = i1;
        state = S1;
        break;
    case S1:
        if(i2) {
            if ( (x + y) > 5) {
                y = y + 5;
                x = -x;
            }
            else {
                y = y + -x;
            }
            state = S0
        }
        break;
}
```

In step 220, a formal extended state finite machine (EFSM) is generated from the high-level representation. Software capable of generating a formal description of an EFSM, such as one in the form of the 5-tuple discussed below, is well-known in the art. The 5-tuple EFSM is defined as $\{S,I,O,D,T\}$ where:

S=a finite set of states;
I=a set of inputs;
O=a set of outputs;
D=a multidimensional linear space; and
T=a set of transitional relations.

Figure 3A:
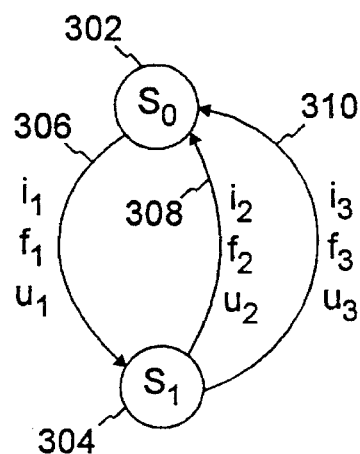
FIG. 3A illustrates an EFSM generated from a high-level description of a hybrid model to which the method of the present invention may be applied.

FIG. 3A illustrates a formal description of an EFSM which corresponds to the hybrid model represented in the BESTMAP-C model in Table 1 above. The EFSM comprises state S0 302 and state S1 304 connected by edges 306, 308 and 310. The states 302 and 304 comprise elements of S. The edges 306, 308 and 310 comprise elements of T. Each of the edges 306, 308, and 310 has associated with it an enabling function $f_n$ and an update function $u_n$. The enabling function describes a condition that must be true in order for the edge to be traversed, while the update function describes how the EFSM variables are affected by traversal of the edge. The expressions describing the enabling functions $f_n$ and update functions $u_n$ for the EFSM in FIG. 3 are given in Table 2.

TABLE 2

$f_1$: {1}
$u_1$: {y = $i_1$}
$f_2$: {(x + y) > 5}
$u_2$: {y = y + 5; x = –x}
$f_3$: {(x + y) ≤ 5}
$u_3$: {y = y + –x}

Each edge may also require, as a prerequisite for traversal, an input $i_m$, which is an element of I. Thus, some edges are traversed only when two conditions are met: 1) an input $i_m$ is received and 2) the enabling condition is satisfied. Furthermore, many state machines produce outputs which comprise the set o, although, for clarity, none are shown in FIG. 3A. The state variable x, which is Boolean, and the state variable y, which is arithmetic, define the linear space D. Thus, the space D is a two-dimensional space comprising points described by (x,y). Finally, a configuration of the EFSM is given by {s,p} where s is a particular state and p is a particular point, (x,y).

The execution or traversal of an EFSM is well known and may be illustrated by the following example. In the EFSM defined by the graph in FIG. 3A and the functions listed in Table 2, the edge 308 has an enabling function $f_2$: {(x+y)>5} and is triggered on an input $i_2$. In order for the machine to traverse from the state s1 304 over edge 308 to the next state s0 302, an input $i_2$ must be received and $f_2$ must be true, in other words, x+y>5. If so, edge 308 is traversed and y is incremented by 5, and x is inverted as dictated by the update function $u_2$. The EFSM then sits in the state S0 302, from which another traversal may occur.

Referring again to FIG. 2, after creation of the EFSM in step 220, the EFSM is converted to a direct sum EFSM in step 230. A direct sum EFSM comprises an EFSM in which all hybrid enabling and update functions are represented in direct sum form. A hybrid enabling or update function is a function of the form $g(X_a, X_b)$ where $X_a$ is a set of arithmetic variables and $X_b$ is a set of Boolean variables. An enabling function is in direct sum form when it is in a form, $g_a(X_a)$ & $g_b(X_b)$, or, in other words, is an and-product of a purely arithmetic expression $g_a$ and a purely Boolean expression $g_b$. An update function is in direct sum form when it is in a form, $g_a(X_a)$ or $g_b(X_b)$, or, in other words, g comprises a function of only one type of variable.

An example of the operation of step 230 is provided by reference to FIG. 3A and Table 2. The enabling function $f_2$: {(x+y)>5} is a hybrid function because $f_2$ is conditioned upon an expression that is dependent upon both the arithmetic variable, y, and the Boolean variable, x. Furthermore, the function $f_2$ is not in direct sum form because $f_2$ does not comprise an and-product of a function of x and a function of y. The function $f_2$ must therefore be converted to direct sum form. The conversion is accomplished by expanding $f_2$ into two enabling functions, $f_{21}$ and $f_{22}$, where $f_{21}$: {x & (y>4)} and $f_{22}$: {$\bar{x}$ & (y>5)}. The resulting $f_{21}$ and $f_{22}$ comprise and-products of Boolean expressions and arithmetic expressions.

A method which may be implemented through software for converting hybrid functions to direct sum form as described in reference to step 230 is discussed below in connection with FIG. 4. By representing the enabling functions in direct sum form, the model may readily be executed symbolically. The direct sum form of the example illustrated in FIG. 3A is shown in FIG. 3B and discussed in further detail below.

In step 240, a derived graph is generated from the direct sum EFSM. A derived graph comprises an alternative representation of an EFSM that facilitates the application of known symbolic execution methods. In the derived graph representation of the EFSM, a plurality of nodes are defined that replace the states in set S of the EFSM. The nodes in the derived graph are derived from the set of enabling functions associated with the edges of the EFSM. The nodes of the derived graph each represent a set of configurations. The set of nodes of the derived graph must satisfy two requirements: 1) they comprise a set of mutually orthogonal functions, in other words, they do not intersect; and 2) they form a basis for the set of enabling functions in the EFSM.

Figure 3B:
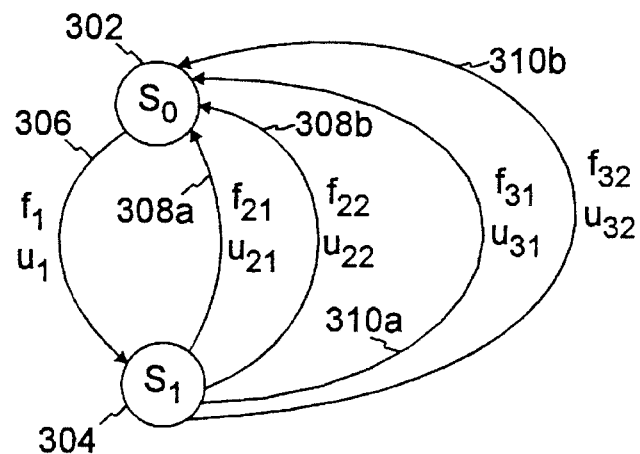
FIG. 3B illustrates a direct sum version of the EFSM illustrated in FIG. 3A.
Figure 3C:
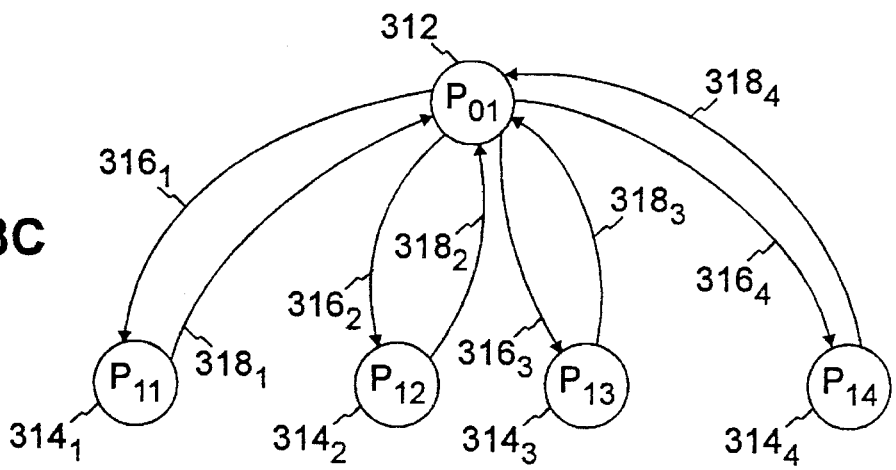
FIG. 3C illustrates a derived graph representation of the direct sum EFSM illustrated in FIG. 3B.

The derived graph of the example illustrated in FIGS. 3A and 3B is shown in FIG. 3C and discussed in further detail below. A method which may be implemented through software for generating a derived graph of an EFSM according to this implementation of the present invention is discussed below in connection with FIG. 5.

In step 250, the apparatus of the present invention retrieves or obtains an initial configuration for the EFSM from which to determine reachability. In other words, an initial starting state is defined and initial values or ranges of values are defined for the EFSM variables. An operator may provide such information through the use of an interactive device such as the keyboard 102 or mouse 107 from FIG. 1. Alternatively, the set of initial configurations may be stored within the external storage device 106 and retrieved therefrom.

In step 260, the reachability analysis is performed by symbolically executing the derived graph. The symbolic execution method discussed below in connection with FIG. 6 may readily be used to determine the cover, or overlapping set of reachable sets. In general, the method of the present invention employs a sequence of set manipulation operations to effect symbolic execution. These set manipulation operations, such as, for example, set intersection and set subtraction, are readily accomplished using binary decision diagrams for the Boolean portion of the EFSM and algebraic methods for the arithmetic portions of the EFSM. Such methods are well known, and are described in Coudert, et al, above, and Dill, et al, above. The present invention, by representing the EFSM in direct sum form allows the powerful Boolean and algebraic symbolic execution methods to be applied to the same model.

The method described generally by the execution of the flow diagram 200 provides a cover of the set of reachable configurations. It should be noted that the cover will comprise a union of reachable sets that include redundancies. Further known set reduction methods may be applied to minimize the cover of reachable configurations to a union of non-redundant subsets.

The processor then provides the results to a means for communicating the results to a human operator. If the method of the present invention is executed by the computing system illustrated in FIG. 1, the results may suitably be provided on the display 101 or in hard copy from the printer 104. The information provided may then be used to determine whether the high-level specification of given hardware model is valid. To this end, the designer or a computer software routine may compare the cover to a set of predetermined results criteria in order to determine if the original high-level specification provided in step 210 is valid.

The flow diagrams in FIGS. 4, 5 and 6, discussed below, illustrate particular implementations of the steps 230, 240 and 260, respectively, of the flow diagram 200 in FIG. 2.

Figure 4:
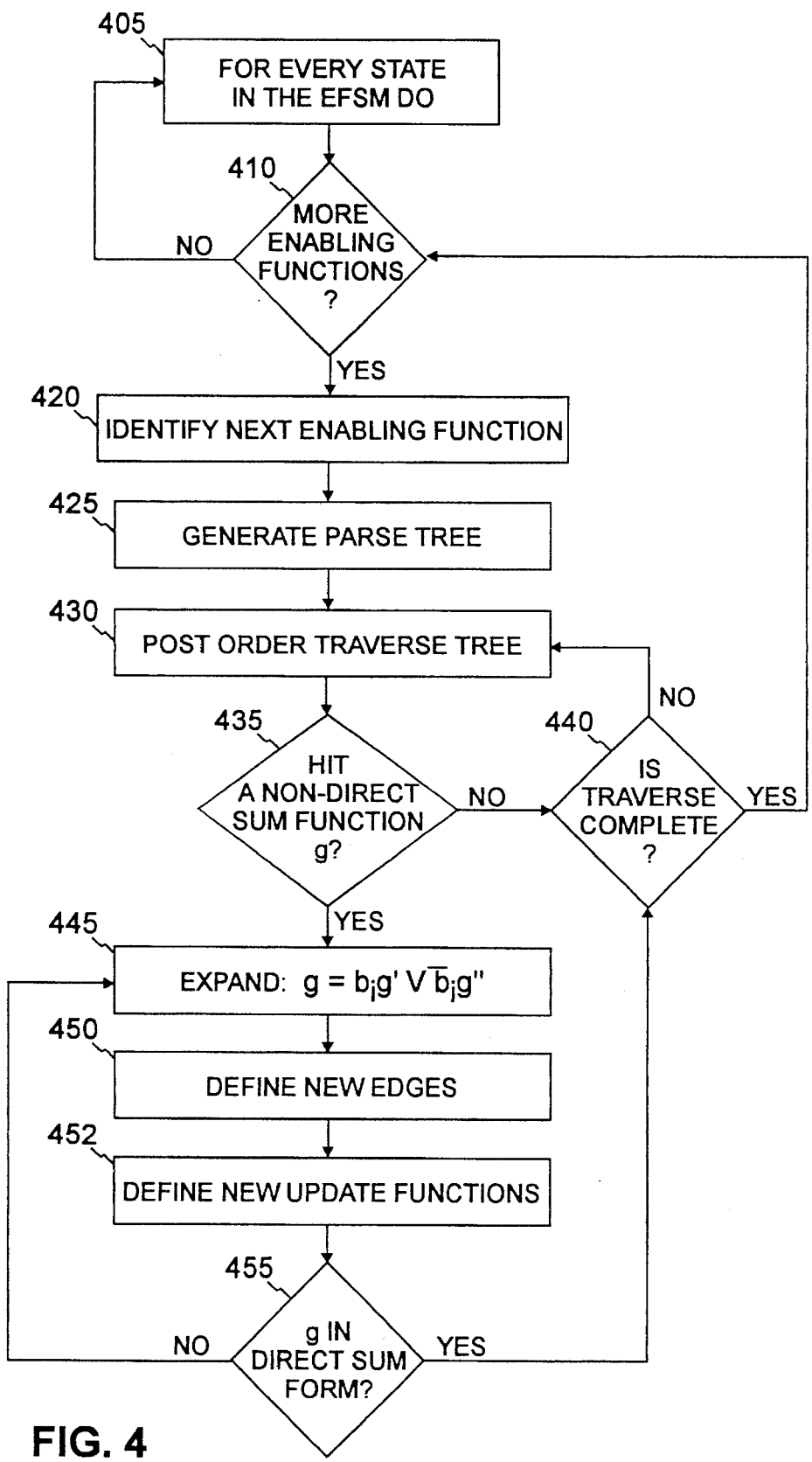
FIG. 4 illustrates a functional flow diagram of the process for generating a direct sum machine from a hybrid EFSM.

Referring to FIG. 4, a functional flow diagram 400 represents a process of converting an EFSM comprising hybrid enabling functions into a direct sum EFSM. The flow diagram 400 represents a subroutine that performs the functions described above in step 230 of FIG. 2 above. As discussed above, in a direct sum representation of an EFSM, each hybrid enabling function is represented as the and-product of Boolean expressions and arithmetic expressions. The functional elements of the flow diagram 400 may readily be programmed into a computer.

In step 405, the processor commences a do-loop wherein the processes in the following steps will be repeated for each state in S of the EFSM, one at a time. After selecting a particular state from the EFSM to process, the processor executes step 410.

In step 410, the processor determines, for the outgoing edges of the selected state, whether there are any hybrid enabling functions that require conversion or, in other words, are not in direct sum form. If, one or more enabling functions requires conversion, then, in step 420, the processor selects one of such enabling functions. If, however, no enabling functions require conversion, the processor returns to step 405.

After execution of step 420, the selected enabling function is converted into direct sum form through the method described below, starting with step 425. In step 425, a parse tree is generated for the enabling function. Parse tree representation of a conditional function is well known in the art.

The processor thereafter begins a post order traverse of the parse tree in step 430. Post order traversal and how to carry out such a traversal in software are known to those of ordinary skill in the art. The processor then proceeds to step 435. In step 435, the processor determines whether the expression defined by the current traverse constitutes a hybrid expression. If not, the processor executes step 440 in order to determine if the post order traverse is complete. If the traverse is not complete, the processor returns to execute step 430 to continue the traverse.

If, however, in step 435, if a hybrid function is detected on the traverse, then the processor executes step 445. In step 445, the enabling function is expanded into two enabling functions. It is known that hybrid function g may be expanded around a Boolean variable $b_i$ within g by creating two functions such that $g = b_i g' \vee \bar{b}_i g''$. For example, consider the function $f_2$: $\{(x+y) > 5\}$ from FIG. 1, where y is an arithmetic variable and x is a Boolean variable. The function $f_2$ may be expanded around x in order to create two functions of the form $f_a$ & $f_b$, (y>5) & $\bar{x}$; (y>4) & x. The conversion thus creates two enabling functions from one.

The processor then executes step 450. In step 450, the processor defines two edges which replace the edge associated with the original enabling function in the EFSM. Each defined edge is associated with one of the expanded enabling functions. Thereafter, in step 452, update functions are defined for the new edges.

The update functions are the same as those associated with the original edge, except that in some circumstances the new enabling function definition may inherently modify the new update functions. For example, consider the edge 310 from FIG. 3A comprising an enabling function $f_3$: $(x+y) \leq 5$, and an update function $u_3$: $y = y + -x$. If $f_3$ is expanded into two direct sum functions, $f_{31}$: x & $(y \leq 4)$ and $f_{32}$: x & $(y \leq 5)$, the corresponding update functions would ordinarily be $u_{31}$: $y = y + -x$ and $u_{32}$: $y = y + -x$. The new update functions, however, may be simplified based on the definitions of $f_{31}$ and $f_{32}$, to $u_{31}$: $y = y$, or $\{\}$, and $u_{32}$: $y = y + 1$. It should be noted that $u_3$, originally a hybrid update function, is now expressed as two nonhybrid functions.

Returning to FIG. 4, after definition of the update functions for the new edges, the processor executes step 455. In step 455, the processor queries whether the expanded function g is currently in direct sum form. If not, the function g is further expanded around another binary variable $b_i$ in the same manner in step 445. Thus, for example, the second expansion would provide four enabling functions, $b_1 b_2 g'$, $\bar{b}_1 b_2 g''$, $b_1 \bar{b}_2 g'''$ and $\bar{b}_1 \bar{b}_2 g''''$. If, however, there are no more unexpended Boolean variables, the processor returns to step 440 and determines whether the parse tree traverse is complete.

FIG. 3B illustrates a direct sum EFSM generated from the EFSM from FIG. 3A. It should be noted that because two enabling functions, $f_2$ and $f_3$ of the EFSM in FIG. 3B required conversion to direct sum form, the edge 308 was replaced by the two edges $308_a$ and $308_b$, and the edge 310 was replaced by the two edges $310_a$ and $310_b$. The new enabling functions and update functions are listed in Table 3.

TABLE 3

| STATE S0 |
| --- |
| $f_1$: $\{1\}$ |
| $u_1$: $\{y = i_1\}$ |
| STATE S1 |
| $f_{21}$: $\{x$ & $(y > 4)\}$ |
| $u_{21}$: $\{y = y + 5; x = -x\}$ |
| $f_{22}$: $\{x$ & $(y > 5)\}$ |
| $u_{22}$: $\{y = y + 5; x = -x\}$ |
| $f_{31}$: $\{x$ & $(y \leq 4)\}$ |
| $u_{31}$: $\{\}$ |
| $f_{32}$: $\{x$ & $(y \leq 5)\}$ |
| $u_{32}$: $\{y = y + 1\}$ |

Otherwise, the direct sum EFSM in FIG. 3B comprises the same elements interrelated in the same manner as the EFSM in FIG. 3A.

To enable the reachability determination using symbolic execution using the Coudert prior art technique, discussed above, the arithmetic expressions must be converted into Boolean expressions. Thus, for example, the expression x+y>5 would be broken down to Boolean equivalents. To convert the arithmetic variable y, it must first be allocated a finite word size. Suppose the variable y is allocated 5 bits in other words, $y_1$, $y_2$, $y_3$, $y_4$ and $y_5$. Such an allocation limits the value of y from 0 to 31, and creates 5 binary variables to replace the single variable y. The present invention overcomes these shortcomings by redefining the enabling functions in a manner that allows Boolean and arithmetic symbolic execution techniques to be concurrently applied to the EFSM, as discussed below. As a result, symbolic execution is facilitated without converting the variables to binary form and the results remain valid independent of the word size eventually chosen for an implementation.

It should be noted that in some cases, an EFSM may also include hybrid update functions, such as $y = y + -x$ from Table 2, where y is arithmetic and x is Boolean. Such hybrid update functions should be converted to update functions of one type of variable, either Boolean or arithmetic. It is known that such functions are easily expanded into two arithmetic update functions with Boolean enabling conditions. For example, the function $y = y + -x$ may be expanded to $y = y + 1$ if $\{\bar{x}\}$ and $y = y$ if $\{x\}$. As was the case in the example discussed above in connection with step 452, such hybrid update functions often fall out during the process of converting the enabling functions to direct sum form. In any event, the conversion process, if necessary, is straightforward and known to those of ordinary skill in the art. For example, a slightly modified version of the parse tree method discussed above in steps 425 through 455 may be applied to hybrid update functions. In such a method, the steps 450 and 452 would comprise defining new edges using the newly created Boolean enabling functions.

Figure 5:
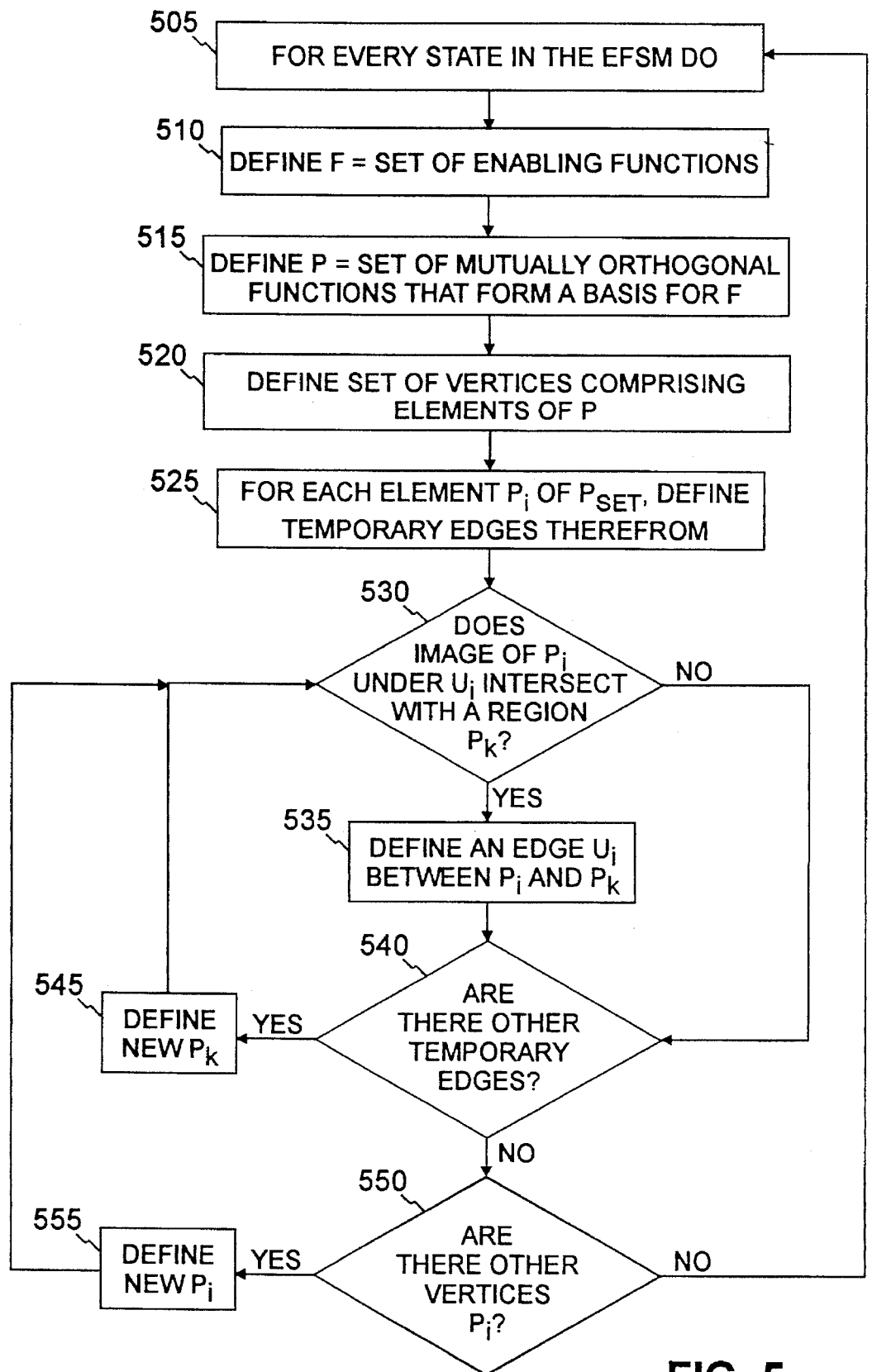
FIG. 5 illustrates a functional flow diagram of the process for generating a derived graph of an EFSM for use in symbolic execution processes.

Referring now to FIG. 5, the flow diagram 500 represents a series of functional steps that perform the functions of step 240 as discussed above in connection with FIG. 2. The flow diagram 500 receives as an input a direct sum EFSM and produces a derived graph therefrom.

A derived graph corresponding to the example direct sum EFSM illustrated in FIG. 3B is shown in FIG. 3C. In FIG. 3C, the derived graph comprises a vertex P01 312 connected through outgoing edges $316_1$ through $316_4$ and incoming edges $318_1$ through $318_4$ to a vertex P11 $314_4$, a vertex P12 $314_2$, a vertex P13 $314_3$ and a vertex P14 $314_4$. The vertex P01 is the derived graph replacement for state S0 302 from FIG. 3A, while the vertices P11 through P14, $314_1$ through $314_4$ comprise the derived graph replacement for state s1 304 from FIG. 3A. FIG. 3C will be referenced periodically during the explanation of FIGS. 5 and 6.

Referring again to FIG. 5, in step 505, the processor, which may suitably be the computer processor 105 of FIG. 1, commences a do-loop wherein the processes in the following steps will be repeated for each state in S of the EFSM. The following steps replace a selected EFSM state with a vertex or set of vertices of the derived graph. As long as there is another EFSM state to process, the processor executes step 510.

In step 510, the processor defines FSET as the set of all enabling functions $F_n$ associated with the state's outgoing edges. Thereafter, in step 515, the processor defines PSET as a set of mutually orthogonal (non-intersecting) functions $P_i$ that form a basis for FSET. In other words, PSET is defined so that every enabling function $F_n$ may be expressed as a union of one or more $P_i$.

Referring again to the example, the set FSET for state s1 as described in Table 3 comprises the four enabling functions. It should be noted that the enabling functions in Table 3 are already mutually orthogonal, in other words, no single point (x,y) satisfies more than one enabling function. Thus, in this example, the set of mutually orthogonal functions PSET that from a basis for FSET are equivalent to the functions in FSET. The set PSET for the state s1 304 of the direct sum EFSM shown in FIG. 3B and described in Table 3 is shown in Table 4.

TABLE 4

P11 (s1): {x & (y > 4)}
P12 (s1) : {(x & (y > 5)}
P13 (s1): {(x & (y ≦ 4)}
P14 (s1) : {(x & (y ≦ 5)}

After the definition of PSET in step 515, the processor proceeds to execute step 520. In step 520, a set of vertices or nodes, one vertex for each $P_i$ are then substituted for the selected state from the direct sum EFSM. Each vertex $P_i$ represents a set of configurations or points as opposed to a singular point, as can be seen by the $P_i$ definitions in Table 4.

It should be noted that any of the original state's incoming edges will extend into each new vertex $P_i$. For example, see FIG. 3C wherein the state s1 304 from FIG. 3B has been replaced with the vertices P11 through P14, $314_1$ through $314_4$: the incoming edge 306 from FIG. 3B is replaced with the four edges $316_1$ through $316_4$.

Returning to FIG. 5, the processor then executes step 525. In step 525, the processor defines temporary outgoing edges from the new vertices. Because PSET is defined in a manner such that it provides a basis for FSET, every point in $P_i$ satisfies at least one enabling function $F_n$. For every enabling function $F_n$ satisfied by a vertex $P_i$, a corresponding outgoing edge from $P_i$ is temporarily defined. The temporary outgoing edge from $P_i$ has the same destination and update function $U_i$ as the original edge associated with the enabling function $F_n$.

Consider for example, the vertex P11 $314_1$ of FIG. 3C. From Table 4, the vertex P11 $314_1$ represents the set of configurations where {x & (y>4)} is satisfied. Because this set of configurations satisfies $f_{21}$, and $f_{21}$ is associated with edge $308_a$ in the EFSM in FIG. 3B, a corresponding edge $318_1$ is temporarily defined that extends from vertex P11 $314_1$. Note that although the traversal of the new edges is not conditioned upon the satisfaction of any enabling functions, the requirement $i_m$ of an input may still apply.

After defining PSET and the temporary edges extending therefrom, the processor executes step 530. In steps 530 to 555, it is determined which temporary edges should be discarded and which should be retained. This step is required particularly when the original EFSM comprises multiple states, each of which is subdivided into multiple vertices $P_1$ through $P_n$. In such cases, several edges may be defined between states that could never be traversed.

To this end, in step 530, it is determined, for a particular vertex $P_i$ having a temporary outgoing edge extending to a destination vertex $P_k$, whether the image of $P_i$ under $U_i$ intersects with the vertex $P_k$. Thus, in step 530, a calculation of the image of $P_i$ under $U_i$ must be taken, IMAGE($P_i$,$U_i$). In other words, the update function $U_i$ must be applied to the set of points that satisfies the condition defined by $P_i$.

Image calculation for vertices defined by hybrid expressions, such as vertex P11 $314_1$ in Table 2, is accomplished by using known image calculation methods for arithmetic and Boolean expressions. Because the method of the present invention defines such hybrid vertices as expression represented in direct sum form, i.e., $P_i$=$P_a$ & $P_b$, the image calculation may be expanded to: IMAGE ($P_i$,$U_i$)=IMAGE($P_a$,$U_i$) & IMAGE ($P_b$,$U_i$). As a result, known methods may be separately applied to the binary and arithmetic portions of $P_i$.

If the answer in step 530 is yes, then the processor executes step 535. In step 535, the temporary edge extending from $P_i$ to $P_k$ is retained as permanent edge, and the processor proceeds to execute step 540. If in step 530, however, the image of $P_i$ under $U_i$ does not intersect with the destination $P_k$, then processor skips directly to step 540.

In step 540, the processor determines whether there are other temporary edges extending from $P_i$ that have not been tested by the procedure of step 530. If so, then step 545 is executed. If not, however, then the processor executes step 550. In step 545, the processor selects a new vertex $P_k$ that comprises the destination of an untested temporary edge extending from $P_i$, and then returns to step 530.

The process of steps 530 to 545 is then repeated for each region $P_i$. To this end, in step 550, the processor determines whether there are other vertices $P_i$ to process. If so, a new $P_i$ is defined in step 555 and the processor returns to step 530. If not, the routine is complete and the processor may return to step 505 to repeat the overall process for another state of the direct sum EFSM.

Upon completion, the method represented in the flow diagram 500 produces a derived graph of the direct sum EFSM. The derived graph representation enables execution of the reachability process discussed below in connection with FIG. 6.

Figure 6:
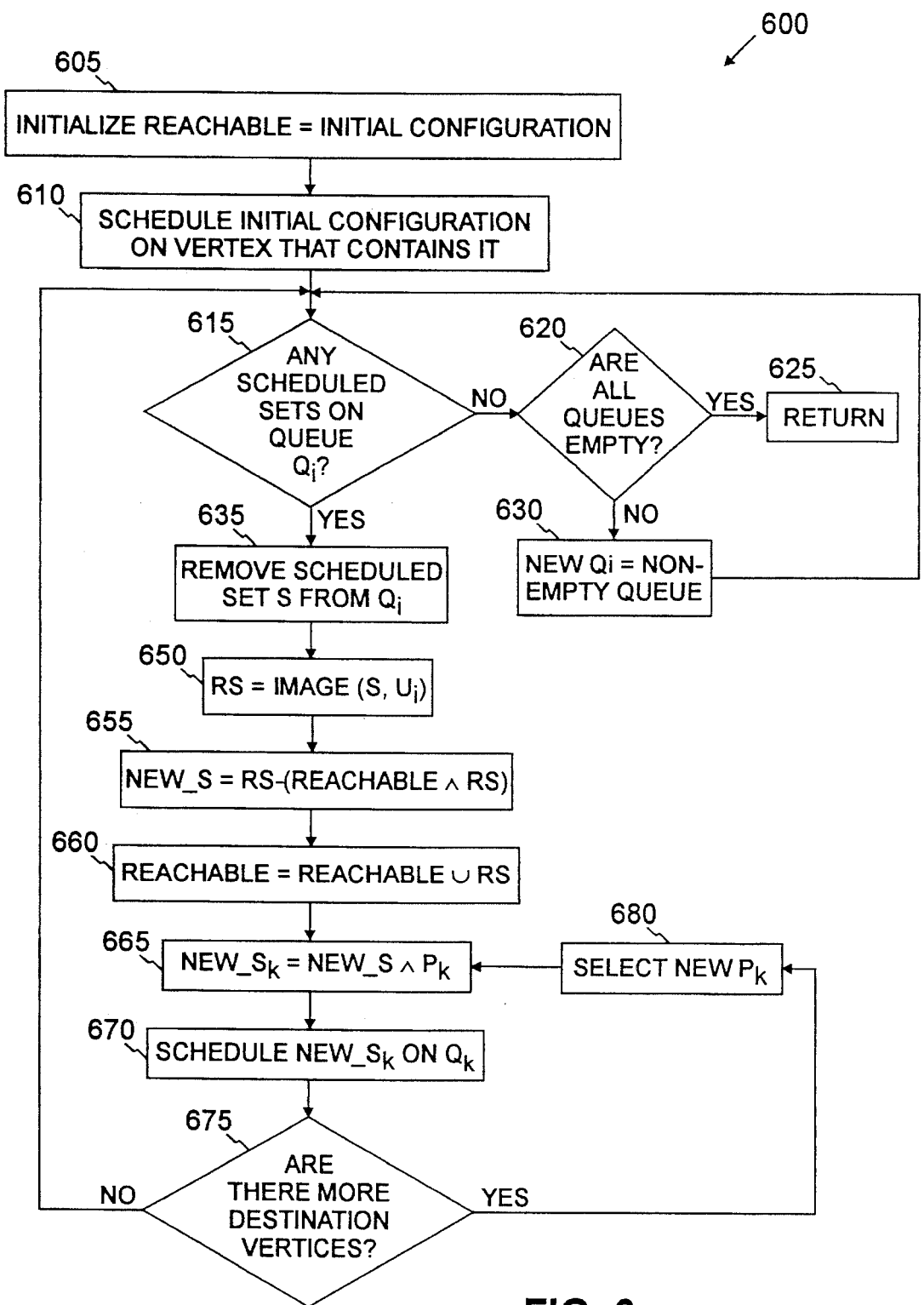
FIG. 6 illustrates a functional flow diagram of the process for determining the reachable sets for the arithmetic and Boolean variables and expressions.

Referring now to FIG. 6, the flow diagram 600 represents a series of functional steps that perform the functions of step 260 as described above in connection with FIG. 2. The flow diagram 600 illustrates a suitable method according to the present invention for effecting symbolic execution of a direct sum EFSM, using its derived graph representation. The derived graph may suitably be one produced using the process described in connection with FIG. 5, above. The derived graph, as discussed above, comprises a series of nodes or vertices, which represent sets of configurations of Boolean variables, algebraic variables, or both. The vertices are connected by edges, the traversal of which results in the application of corresponding update functions.

In step 605, a set REACHABLE is defined. REACHABLE represents the set of all reachable configurations, where a configuration is a value {S,N} in which S comprises a state from the original EFSM and N represents a point in the linear space defining the EFSM. The method embodied by the flow diagram 600 operates to update or augment the set REACHABLE. In step 605, the set REACHABLE comprises the initial configuration. The initial configuration may comprise a point or a set of points, and for hybrid machines, may consist of algebraic polyhedral regions and binary configurations.

Consider, for example, the EFSM illustrated in FIG. 3A which corresponds to the derived graph EFSM discussed above in connection with FIG. 3C. The initial configuration may comprise an originating state s0 and the point (x=0, y=—), where "—" signifies "don't care". Thus, for this example, the set REACHABLE already comprises the set of configurations [s0, (0, —)].

As part of the initialization procedure of step 605, the processor defines a queue for all vertices in the derived graph. In other words, for all of PSET, each $P_i$ has a corresponding queue $Q_i$. After execution of the step 605, the processor proceeds to step 610. In step 610, the processor schedules the portion of the initial configuration on the queue of appropriate vertex.

Referring again to the example, five queues Q0 through Q5 are set up for the five vertices 312 and $314_1$ through $314_4$, respectively, of the derived graph in FIG. 3C. According to the above-defined initial condition, the set of points (0, —) is scheduled on the queue Q0, which corresponds to the vertex P01 312.

Returning to FIG. 6, the processor then executes step 615 to begin the iterative procedure of determining the cover, or the set REACHABLE. In step 615, the processor chooses a queue $Q_i$ and queries whether any sets are scheduled on the queue. If not, there is no processing to be done on the $Q_i$ and the processor proceeds to step 620. In step 620, the processor queries whether all the queues are empty. If all queues are empty, the iterative procedure is complete and the set of reachable configurations has been determined. The processor then exits the routine in step 625. Otherwise, if there are non-empty queues, the processor picks a new non-empty $Q_i$ in step 630 and returns to step 615.

If, however, in step 615, there are remaining sets scheduled on queue $Q_i$, the processor executes step 635. In step 635, a scheduled set S is removed from $Q_i$. The processor then executes step 650. In step 650, for an outgoing edge from $P_i$ extending to one or more destination vertices $P_k$, the image of the scheduled set S is taken under $U_i$. The image calculation may be described as RS=IMAGE (S, $U_i$). RS represents the resulting set when the all the points in S traverse the edge.

Consider again the example discussed above. The image of the initial configuration, [S0, (0, —)], under the update function for P01(S0), y=$i_1$, is [S1, (0, $i_1$)]. If the input $i_1$ is initially defined so that $i_1$<10, then the corresponding image ((0, —), y=$i_1$) is [s1, (0, <10)].

In step 655, the processor defines the value NEW_S as the portion of the image RS that has not been previously reached. In other words, NEW_S=RS−(REACHABLE ∧ RS). Set subtraction and intersection are well-known operations in set algebra. Applying step 655 to the example, it is noted that RS=[S1, (0, <10)] and REACHABLE=[S0, (0, —)]. Therefore, RS ∧ REACHABLE=[ϕ], because s1 does not intersect with s0. As a result, NEW_S= RS, or [S1, (0, <10)].

After step 655, the processor executes step 660. In step 660, the set of reachable states is updated to include the newly determined image RS, REACHABLE=REACHABLE U RS. Thus, in the above-described example, REACHABLE=[S0, (0, —)]U[S1, (0, <10)].

Once REACHABLE has been updated in step 660, the newly reached sets NEW_S must be scheduled for further iterations in step 665. To this end, in step 665, the processor selects a destination vertex $P_k$, and intersects $P_k$ with NEW_S, which may be expressed as: NEW_$S_k$=NEW_S ∧ $P_k$. The vertex $P_k$ is selected from one of the destination vertices of the $P_i$'s outgoing edges. Set intersection is well known. The processor then executes step 670, wherein the region NEW_$S_k$ is scheduled on $Q_k$ in step 670.

In step 675, the processor queries whether there are more destination vertices, in other words, other $P_k$. If there are other $P_k$, then, in step 680, a new $P_k$ is selected in step 680 and the processor returns to step 665. If the answer in step 675 is no, however, the processor returns to step 615.

In an alternative embodiment of the present invention, the methods described herein may be applied to verify or validate a communications protocol specification. In this embodiment, step 210 in FIG. 2 would be replaced by a step in which a high-level description of a communications protocol is provided. Such high-level specifications may be provided in a communications protocol description language, such as, for example, ESTELLE. See, for example, Budkowski, et al., "An Introduction to Estelle: A Specification Language for Distributed Systems," *Computer Networks and ISDN Systems* 25–59 (1987). A high-level description such as one described in the ESTELLE language is readily converted into an EFSM by those of ordinary skill in the art.

It is to be understood that the above-described embodiments of the invention are merely illustrative. Other implementations may readily be devised by those skilled in the art which will embody the principles of the invention and fall within the spirit and scope thereof.

We claim:

1. A method of validating a high-level specification of a sequential circuit design, the high-level specification including both arithmetic variables and Boolean variables, the method comprising:

a) generating an extended finite state machine from the high-level specification, said extended finite state machine comprising at least one state connected to one or more outgoing edges, each outgoing edge terminating in one of the at least one states;

b) converting the extended finite state machine into a direct sum extended finite state machine;

c) generating a derived graph of the direct sum machine, said derived graph comprising a plurality of vertices connected by at least one edge;

d) obtaining an initial configuration;

e) effecting symbolic execution of the derived sum machine using the initial configuration, said symbolic execution providing a set of configurations reachable from the initial configuration; and f) providing the set of reachable configurations to a means for communicating said set of reachable configurations to a human operator.

2. The method of claim 1 further comprising the step of:

g) applying a predetermined set of criteria to the set of reachable configurations, said application producing a signal indicating whether the high-level specification is valid.

3. The method of claim 1 wherein the extended finite state machine further comprises at least one non-direct sum hybrid enabling function corresponding to at least one outgoing edge of the extended finite state machine, and the step b) further comprises the step of converting the at least one hybrid enabling function into direct sum form.

4. The method of claim 3 wherein the step of converting at least one hybrid enabling function into direct sum form further comprises expanding the non-direct sum hybrid enabling function into two direct sum enabling functions.

5. The method of claim 1 wherein at least one outgoing edge of the extended finite state machine has one or more enabling functions and at least one outgoing edge has one or more update functions.

6. The method of claim 5 wherein the plurality of vertices of the derived graph comprise a set of mutually orthogonal functions that are derived from the one or more enabling functions of at least one outgoing edge of the extended finite state machine.

7. The method of claim 1 wherein the symbolic execution of the derived graph employs set manipulation operations, the set manipulation operations including Boolean set manipulation operations and arithmetic set manipulation operations.

8. The method of claim 1 wherein the symbolic execution of the derived graph employs set manipulation operations, the set manipulation operations including the manipulation of binary decision diagrams and algebraic polyhedral regions.

9. A method of determining the set of reachable configurations in an EFSM, the EFSM being partially defined by a set of enabling functions, at least one of the set of enabling functions being a non-direct sum hybrid enabling function dependent on at least one Boolean variable and at least one arithmetic variable, the method comprising:

a) selecting a non-direct sum enabling function from the set of enabling functions;

b) converting the non-direct sum hybrid enabling function into an and-product of a Boolean variable expression and an arithmetic variable expression;

c) repeating steps a and b for all non-direct sum hybrid enabling functions in the set of enabling functions;

d) obtaining a set of initial configurations; and e) employing symbolic execution to determine the set of configurations reachable from the set of initial configurations.

10. The method of claim 9 further comprising the step of generating a derived graph of the EFSM prior employing symbolic execution to determine the set of reachable states.

11. The method of claim 9 wherein step b) further comprises the step of expanding the non-direct sum hybrid enabling functions into two direct sum enabling functions.

12. The method of claim 9 wherein said method is applied to an EFSM representation of a high-level specification of a sequential circuit design.

13. The method of claim 9 wherein said method is applied to an EFSM representation of a high-level specification of a communications protocol specification.

14. An apparatus for validating a high-level specification of a sequential circuit design, the high-level specification including both arithmetic variables and Boolean variables, the apparatus comprising:

a) storage means for storing a high-level specification of a sequential circuit design;

b) an interactive means for receiving input from a human operator;

c) a computer processor connected to the storage means and further connected to the interactive means, said computer processor operable to generate a direct sum EFSM from the high-level specification and further operable to symbolically execute the direct sum EFSM; and d) means connected to the computer processor for communicating the results of the symbolic execution of the direct sum EFSM to a human operator.

15. The apparatus of claim 14 wherein the interactive means comprises a keyboard.

16. The apparatus of claim 14 wherein the results communicating means comprises a visual display device.

17. The apparatus of claim 14 wherein the results communicating means comprises a printing device.

18. An apparatus for validating a high-level specification of a sequential circuit design, the high-level specification including at least one arithmetic variable and at least one boolean variable, the apparatus comprising:

a) an external memory device for the storage of the high level specifications;

b) a keyboard for receiving input from a human operator;

c) a computer processor connected to the external memory device and the keyboard, said computer processor operable to generate a direct sum EFSM from the high-level specification and further operable to execute symbolically the direct sum EFSM; and d) a video display for displaying the results of the symbolic execution of the direct sum EFSM to a human operator.

19. A method of validating a high-level specification of a communications protocol specification, the high-level specification including both arithmetic variables and Boolean variables, the method comprising:

a) generating an extended finite state machine from the high-level specification, said extended finite state machine comprising at least one state connected to one or more outgoing edges, each outgoing edge terminating in one of the at least one states;

b) converting the extended finite state machine into a direct sum extended finite state machine;

c) generating a derived graph of the direct sum machine, said derived graph comprising a plurality of vertices connected by at least one edge;

d) obtaining an initial configuration;

e) effecting symbolic execution of the derived sum machine using the initial configuration, said symbolic execution providing a set of configurations reachable from the initial configuration; and f) providing the set of reachable configurations to a means for communicating said set of reachable configurations to a human operator.

20. The method of claim 19 further comprising the step of:

g) applying a predetermined set of criteria to the set of reachable configurations, said application producing a signal indicating whether the high-level specification is valid.

* * * * *